US010185000B2

(12) United States Patent
Holle

(10) Patent No.: US 10,185,000 B2
(45) Date of Patent: Jan. 22, 2019

(54) MRI BIRDCAGE COIL WITH DISTRIBUTED EXCITATION

(71) Applicant: KONINKLIJKE PHILIPS N.V., Eindhoven (NL)

(72) Inventor: Eerke Holle, Eindhoven (NL)

(73) Assignee: Koninklikje Philips N.V., Eindhoven (NL)

( * ) Notice: Subject to any disclaimer, the term of this patent is extended or adjusted under 35 U.S.C. 154(b) by 101 days.

(21) Appl. No.: 15/516,048

(22) PCT Filed: Oct. 2, 2015

(86) PCT No.: PCT/EP2015/072784
§ 371 (c)(1),
(2) Date: Mar. 31, 2017

(87) PCT Pub. No.: WO2016/058841
PCT Pub. Date: Apr. 21, 2016

(65) Prior Publication Data
US 2017/0299671 A1    Oct. 19, 2017

(30) Foreign Application Priority Data

Oct. 16, 2014 (EP) .................................... 14189252

(51) Int. Cl.
*G01R 33/34* (2006.01)
*G01R 33/36* (2006.01)
*G01R 33/565* (2006.01)

(52) U.S. Cl.
CPC ... *G01R 33/34076* (2013.01); *G01R 33/3607* (2013.01); *G01R 33/3614* (2013.01); *G01R 33/5659* (2013.01); *G01R 33/3678* (2013.01)

(58) Field of Classification Search
CPC ............ G01R 33/3607; G01R 33/3614; G01R 33/3678; G01R 33/34076; G01R 33/5659
See application file for complete search history.

(56) References Cited

U.S. PATENT DOCUMENTS 4,680,548 A    7/1987  Edelstein et al.
6,043,658 A    3/2000  Leussler
(Continued)

FOREIGN PATENT DOCUMENTS

EP    2015094 A1    1/2009
WO    02095435 A1    11/2002
(Continued)

OTHER PUBLICATIONS

Wang et al "Optimization of a Multi-Channel Transmit Quadrature Receive Birdcage Coil" Proc. Intl. Soc. Mag. Reson. Med. 14, Jan. 1, 2006 p. 3539.
(Continued)

*Primary Examiner* — Gregory H Curran

(57) ABSTRACT

A magnetic resonance radio frequency transmission device (140) for generating and applying a radio frequency excitation field $B_1$ for the purpose of magnetic resonance examination comprises a birdcage coil (144) and a plurality of M radio frequency amplifier units for providing radio frequency power at a magnetic resonance frequency to the birdcage coil (144) via a plurality of M activation ports (158) selected out of the plurality of N activation ports (158). In an operational state of the birdcage coil (144) each radio frequency amplifier unit (142) is electrically connected and is arranged in close proximity to an activation port (158). Among the plurality of M radio frequency amplifier units (142), there is established a fixed relationship of adjustable phase angles ($\varphi$) of the magnetic resonance radio frequency power provided by the plurality of M radio frequency amplifier units (142); a method of generating and applying a radio frequency excitation field B for the purpose of magnetic resonance examination, using such magnetic resonance radio frequency transmission device (140); and a magnetic resonance imaging system (110) configured for acquiring magnetic resonance images of at least a portion of (Continued)

a subject of interest (120), comprising such magnetic resonance radio frequency transmission device (140).

8 Claims, 7 Drawing Sheets

(56) References Cited

U.S. PATENT DOCUMENTS

| | | |
|---|---|---|
| 7,977,944 B2 | 7/2011 | Oppelt et al. |
| 2009/0134873 A1* | 5/2009 | Cho ................ G01R 33/34046 |
| | | 324/318 |
| 2010/0102817 A1* | 4/2010 | Saha ................ G01R 33/34046 |
| | | 324/318 |
| 2012/0062230 A1 | 3/2012 | Vaughan, Jr. |
| 2015/0253393 A1* | 9/2015 | Harvey ............ G01R 33/34076 |
| | | 324/322 |

FOREIGN PATENT DOCUMENTS

| | | |
|---|---|---|
| WO | 2004061469 A1 | 7/2004 |
| WO | 2006076624 A1 | 7/2006 |
| WO | 2012143833 A1 | 10/2012 |
| WO | 2014053289 A1 | 4/2014 |

OTHER PUBLICATIONS

Yazdanbakhsh et al "Variable Power Combiner for RF Mode Shimming in 7-T MR Imaging" IEEE Transactions on Biomedical Engineering, vol. 59, No. 9, Sep. 1, 2012 p. 2549-2557.

Vaughan et al "RF Coil Element Mounted Power Amplifiers" Proc. Intl. Soc. Mag.Reson. Med. 19 (2011) p. 1851.

* cited by examiner

MRI BIRDCAGE COIL WITH DISTRIBUTED EXCITATION

This application is a U.S. national phase application of International Application No. PCT/EP2015/072784, filed on Oct. 2, 2015, which claims the benefit of EP Application Ser. No. 14189252.1 filed on Oct. 16, 2014and is incorporated herein by reference.

FIELD OF THE INVENTION

The invention pertains to a magnetic resonance radio frequency transmission device for the purpose of magnetic resonance examination, and a method of generating and applying a radio frequency excitation field $B_1$ for the purpose of magnetic resonance examination, using such magnetic resonance radio frequency transmission device.

BACKGROUND OF THE INVENTION

In the art of magnetic resonance examination, the birdcage resonator, also known as birdcage coil, is a well-known volume radio frequency coil design for generating a radio frequency magnetic excitation field $B_1$ to be applied to nuclei of or within a subject of interest for magnetic resonance excitation, wherein the subject of interest is positioned at least partially within the birdcage coil, which in turn is arranged within a static, homogeneous magnetic field $B_0$ arranged substantially perpendicular to the radio frequency magnetic excitation field $B_1$.

In the art, birdcage resonators are known to serve as radio frequency transmit coils and/or radio frequency receive coils. They are usually operated in resonance at a radio frequency corresponding to the Larmor frequency, which depends on the strength of the static magnetic field $B_0$ in the gyromagnetic magnetic ratio of the species of nuclei under consideration.

U.S. Pat. No. 4,680,548 describes the volume radio frequency coil design, later referred to as the "birdcage coil" for its appearance, as a magnetic resonance radio frequency coil having a pair of conductive loop elements spaced along a common longitudinal axis. Each of the loop elements includes a plurality of serially-connected capacitive elements spaced along the loop peripheries. A plurality of axial conductive elements (commonly referred to as "rungs") electrically interconnect the conductive loop elements at points between adjacent ones of the serially connected capacitive elements. In the high-pass embodiment of the radio frequency coil, the axial conductive segments may be wires, conducting tubes or flat conductive tapes whose inherent inductance is needed for proper coil operation. A band-pass embodiment of the coil is realized by including capacitive elements in each of the axial conductive segments. Birdcage coils are known to have as many resonant modes as there are radial or axial conductive segments. The preferred excitation mode for the birdcage coil is the one in which a generated radio frequency magnetic excitation field $B_1$, when operated as a transmit coil, is as homogenous as possible. This is the case for resonant modes whose current distribution in the rungs is proportional to sin θ or cos θ, respectively, wherein θ denotes the azimuthal angle measured circumferentially about the birdcage coil axis.

U.S. Pat. No. 4,680,548 further describes to operate the birdcage coil in a quadrature excitation mode in which the birdcage coil transmits a circularly polarized radio frequency magnetic field, known to maximally interact with nuclei spins. To this end, the birdcage coil is excited at two input capacitors located at right angles relative to one another, for instance along the circumference of one of the conductive loop elements, by two radio frequency sources that are electrically 90° out of phase relative to one another. In the case of quadrature excitation, the magnitude of the currents in each rung is equal while the relative phase angle increments in a linear manner with the azimuthal angle θ.

It is further known that for static magnetic fields $B_0$ of large field strength such as 3 T or higher, dielectric-based standing wave mechanisms related to the subject of interest severely affect the homogeneity of the radio frequency magnetic excitation field $B_1$. One option for improving homogeneity of the radio frequency magnetic excitation field $B_1$ in a birdcage coil in this case has been suggested in U.S. Pat. No. 6,043,658. Herein, a band-pass birdcage coil is described to be operated in a degenerate mode of operation in which all resonance modes and all resonance frequencies coincide, which is achieved by selecting specific values for the capacitances in the rungs and the conductor loops, respectively. Individual meshes (each mesh comprising two neighboring conductors and the sections of the two conductor loops which are situated in between) of the birdcage coil are then decoupled from one another, and thus operation as a coil array is enabled, wherein each coil can independently be driven by a radio frequency amplifier in order to optimize the uniformity of the radio frequency magnetic excitation field $B_1$ (so-called radio frequency "shimming").

In international application WO 2014/053289 A1, a band-pass birdcage coil is described wherein the ratio of ring to rung capacitance values is chosen to realize N resonant modes, each tuned to the same resonance frequency, whereby, for each resonant mode, individual meshes of the birdcage resonator are not substantially electrically decoupled from each other. The radio frequency magnetic excitation fields $B_1$ generated in the different resonant modes are then not equal in spatial distribution to those of the degenerate mode of operation described in U.S. Pat. No. 6,043,658 and allow for linear combination such that a power-efficient, uniform, circularly polarized field distribution of the radio frequency magnetic excitation fields $B_1$ can be accomplished.

The international application WO02/095435 concerns an arrangement of generating RF fields in the examination volume of an magnetic resonance examination system. Control of the RF field distribution is achieved by individual selection of the phase and amplitude of the RF feeding to each of the resonator segments. The international application WO2006/076624 discloses a birdcage coil which has a ring resonator provided to the end-rings of the birdcage resonator. A fixed 90° quadrature splitter creates a travelling wave about the ring resonator to drive the birdcage coil in the quadrature mode.

SUMMARY OF THE INVENTION

A conventional way of operating a birdcage coil in quadrature mode would be, for instance, to excite the birdcage coil with identical radio frequency power having a fixed phase angle difference of 90° at two loop capacitors located at right angles relative to one another with respect to an azimuthal direction about a center axis of the birdcage coil. A typical conventional configuration is schematically shown in FIG. 7. In order to accomplish an appropriate field strength of a radio frequency excitation field $B_1$ in an examination space, a total radio frequency power in the range of about 35 kW is required, which means employing two radio frequency amplifiers $42_1$ and $42_2$ with a maximum power rating of about 18 kW each. Each radio frequency amplifier $42_1$, $42_2$ is connected with the birdcage coil 44 via a radio frequency transmission line and a radio frequency circulator $76_1$, $76_2$ connected in series for dumping radio frequency power reflected by the birdcage coil 44. The radio frequency circulators $76_1$, $76_2$ are bulky, heavy and expensive. The transmission lines have to have an appropriate power rating and thus are heavy, and a trade-off between cost, weight and loss of radio frequency power is required. The amplifiers $42_1$, $42_2$ may comprise individual radio frequency power transistors in push-pull configuration with a power rating in a regime of about 1 kW, so that a plurality of radio frequency combiners, usually installed in one cabinet, is also required.

It is therefore an object of the invention to provide a magnetic resonance radio frequency transmission device for generating and applying a radio frequency excitation field $B_1$ for the purpose of magnetic resonance examination with less hardware components, while allowing for flexible operation with regard to generating radio frequency excitation fields $B_1$, in particular including 2-mode radio frequency shimming, wherein the "2-mode" refers to the two excitation modes at the Larmor frequency of the body coil.

In one aspect of the present invention, the object is achieved by a magnetic resonance radio frequency transmission device for generating and applying a radio frequency excitation field $B_1$ of a magnetic resonance frequency to nuclei of or within a subject of interest for the purpose of magnetic resonance examination. The magnetic resonance radio frequency transmit transmission device comprises a birdcage coil that includes:

a pair of conductive loop members spaced along a common longitudinal axis, a plurality of N conductive segments aligned parallel to an axial direction and electrically interconnecting the conductive loop members, and a plurality of N activation ports, each activation port being configured to receive radio frequency power and to transfer the received radio frequency power to the birdcage coil for generating a portion of the radio frequency excitation field $B_1$, wherein the plurality of N activation ports is located in close proximity to the birdcage coil;

wherein the birdcage coil is designed to be excitable at at least N/2 separate resonance frequencies.

The magnetic resonance radio frequency transmission device further includes a plurality of M radio frequency amplifier units. Each radio frequency amplifier unit of the plurality of M radio frequency amplifier units is configured for receiving radio frequency power from a radio frequency source, for amplifying the received radio frequency power and for providing radio frequency power at a magnetic resonance frequency to the birdcage coil via a plurality of M activation ports out selected out of the plurality of N activation ports, wherein M is less than or equal to N. Each radio frequency amplifier unit of the plurality of M radio frequency amplifier units is configured to provide an individually adjustable level of radio frequency power at the magnetic resonance frequency to one activation port of the plurality of M activation ports.

Further, in an operational state of the birdcage coil, each radio frequency amplifier unit of the plurality of M radio frequency amplifier units is electrically connected to an activation port of the plurality of N activation ports by a radio frequency transmission line, and is arranged in close proximity to the activation port to which it provides radio frequency power. Then, in the operational state of the birdcage coil, among the plurality of M radio frequency amplifier units there is established a fixed relationship of adjustable phase angles and adjustable magnitudes of the magnetic resonance radio frequency power provided by the plurality of M radio frequency amplifier units.

The phrase "birdcage coil", as used in this application, shall be understood particularly to encompass high-pass type birdcage coils having capacitors in the two conductive loop elements spaced along a common longitudinal axis, low-pass type birdcage coils having capacitors in the axial conductive segments electrically connecting the spaced two conductive loop elements along a common longitudinal axis, and band-pass type birdcage coils having capacitors in the two conductive loop elements as well as in in the axial conductive segments electrically connecting the spaced two conductive loop elements.

The phrase "separate resonance frequencies", as used in this application, shall be understood particularly such that peak amplitudes of two arbitrarily selected resonance frequencies are spaced by a frequency interval that is larger than a sum of 50% of the Full Widths at Half Maximum (FWHM) of the two resonance frequencies.

The phrase "close proximity", as used in this application, shall be understood particularly as a spatial distance between a radio frequency amplifier unit and a corresponding activation port that is less than $\lambda/4$, preferably less than $\lambda/8$, and most preferably less than $\lambda/10$ of an effective wavelength $\lambda$ of the resonance frequency.

The phrase "effective wavelength", as used in this application, shall be understood particularly as the wavelength of the resonance frequency traveling in a transmission line having a velocity factor different from 100%. In this case, the effective wavelength is the wavelength of the resonance frequency in vacuum multiplied by the velocity factor (e.g., the velocity factor for commonly used radio frequency cable RG 58 is 66%).

One advantage of the invention lies in that, in a suitable embodiment, expensive radio frequency components such as radio frequency amplifier units can be substituted with hardware components of lower power specifications.

Another advantage lies in that no circulators are required due to the close proximity between radio frequency amplifier unit and corresponding activation port, and at least two long lossy radio frequency power cables (typically −1.8 dB) and radio frequency power combiners can be omitted due to the fact that the birdcage coil, having separate resonance frequencies, spreads radio frequency power that is fed to it among its meshes.

Furthermore, the magnetic resonance radio frequency transmission device of the invention advantageously provides the options of operating the birdcage coil in quadrature mode excitation or in independent dual radio frequency channel (2-mode excitation) multiple transmission mode, e.g. for radio frequency shimming purposes.

In a preferred embodiment, the number N of conductive segments aligned parallel to an axial direction and electrically interconnecting the conductive loop members is an integer multiple of the number M of radio frequency amplifier units of the plurality of radio frequency amplifier units.

In suitable embodiments, exploiting symmetry properties of the arrangement of radio frequency amplifier units and activation ports, the fixed relationship of adjustable phase angles can readily be established, and a load on the hardware components such as the rungs and the radio frequency amplifier units can advantageously be equalized.

In another preferred embodiment, the conductive segments of the plurality of N conductive segments aligned parallel to the axial direction are equidistantly arranged with respect to an azimuthal direction about the common longitudinal axis of the birdcage coil. In this way, large differences in radio frequency current load in the conductive segments for generating a homogeneous radio frequency excitation field $B_1$ can be avoided.

In yet another preferred embodiment, the magnetic resonance radio frequency transmission device further comprises a control unit that is configured for controlling the individually adjustable level of radio frequency power provided at the magnetic resonance frequency by the plurality of M radio frequency amplifier units, and/or for controlling the fixed relationship of adjustable phase angles of the magnetic resonance radio frequency power among the plurality of M radio frequency amplifier units.

The control unit may be a separate control unit that is especially assigned to control the magnetic resonance radio frequency transmission device. Alternatively, the control unit may be an integral part of another control unit of a magnetic resonance examination apparatus, such as a magnetic resonance imaging system.

In this way, the individual levels of radio frequency power provided by the plurality of radio frequency amplifier units and/or the fixed relationship of adjustable phase angles among the plurality of radio frequency amplifier units can readily and reliably be set with little susceptibility to human error, and can also be quickly changed to different radio frequency power levels of and a different fixed relationship of adjustable phase angles among the plurality of radio frequency amplifier units, if desired. Preferably, the different radio frequency power levels and the different fixed relationship of adjustable phase angles can be pre-determined and stored in a digital memory unit of the control unit for retrieving.

Preferably, the control unit comprises a digital wave generator based on a field programmable gate array that is configured for digitally establishing the fixed relationship of adjustable phase angles among the plurality of M radio frequency amplifier units, and for setting the individually adjustable levels of radio frequency power at the magnetic resonance frequency at the plurality of M radio frequency amplifier units.

Preferably, the digital wave generator is based on a field programmable gate array. This type of digital wave generator is commercially available and therefore does not have to be discussed in detail herein.

By employing a digital wave generator, a fixed relationship of adjustable phase angles between the radio frequency amplifier units of the plurality of M radio frequency amplifier units can readily be established and/or their individual radio frequency power levels can be set and quickly changed as desired.

In one embodiment, the fixed relationship of adjustable phase angles and the individually adjustable levels of radio frequency power at the magnetic resonance frequency of the plurality of M radio frequency amplifier units are set for operating the birdcage coil in the quadrature mode. In this way, the quadrature mode of the birdcage coil, as is commonly used in magnetic resonance examination, can readily be excited with less hardware components of lower power specifications.

Alternatively, the fixed relationship of adjustable phase angles can be established and the individually adjustable levels of radio frequency power at the magnetic resonance frequency of the plurality of M radio frequency amplifier units are set for operating the birdcage coil such that inhomogeneity of the frequency excitation field $B_1$ inside the subject of interest is compensated. In this way, the magnetic resonance radio frequency transmission device allows for operation as a dual radio frequency channel multi-transmission coil for radio frequency shimming purposes.

In yet another preferred embodiment, the magnetic resonance radio frequency transmission device comprises a radio frequency transmission line having
  an effective electrical length corresponding to substantially one wavelength of the magnetic resonance frequency, wherein two ends of the radio frequency transmission line are electrically connected to form a loop, and
  a plurality of N contact points, electrically contacting the radio frequency transmission line and being arranged along the radio frequency transmission line in a spaced manner, wherein at least two contact points of the plurality of N contact points are each configured for receiving radio frequency power from at least two radio frequency sources.

The number of radio frequency amplifier units of the plurality of M radio frequency amplifier units equals the number of activation ports of the plurality of N activation ports. Each contact point of the plurality of N contact points is electrically connected to a different radio frequency amplifier unit of the plurality of M=N radio frequency amplifier units.

By that, the fixed relationship of adjustable phase angles of the magnetic resonance radio frequency power provided by the plurality of M=N radio frequency amplifier units can be readily established in an analog manner, wherein the phase angle shift between two adjacent radio frequency amplifier units, fixed at 360°/N, is determined by the effective electrical length of the portion of the radio frequency transmission line between the contact points that are electrically connected to the two adjacent radio frequency amplifier units, fixed at $\lambda/N$. In one suitable embodiment, wherein for instance each of the at least two radio frequency sources excites one mode of the birdcage coil at an equal level of radio frequency power but with a phase difference of 90°, the birdcage coil can be excited in quadrature mode. In another suitable embodiment, the birdcage coil can also be driven in a dual radio frequency channel multi-transmission mode for radio frequency shimming purposes, for instance with the two independent radio frequency sources having an unequal level of radio frequency power and/or a phase difference that is different from 90°.

In another aspect of the present invention, a method of generating and applying a radio frequency excitation field $B_1$ for the purpose of magnetic resonance examination, using an embodiment of the magnetic resonance radio frequency transmission device as disclosed herein.

The method comprises steps of:
  providing radio frequency power from radio frequency sources to the plurality of M radio frequency amplifier units;
  controlling individually adjustable levels of radio frequency output power provided at the magnetic resonance frequency by the plurality of M radio frequency amplifier units to a desired radio frequency power level;
  controlling the relationship of adjustable phase angles of the magnetic resonance radio frequency output power among the plurality of M radio frequency amplifier units to a desired fixed relationship of phase angles.

The method can allow for excitation of the birdcage coil in quadrature mode as well as in a dual radio frequency channel multi-transmission mode, for instance for radio frequency shimming purposes, by using less and less expensive hardware components. Other benefits described before for the magnetic resonance radio frequency transmission device apply as well.

In another preferred embodiment of the method using a magnetic resonance radio frequency transmission device whose conductive segments of the plurality of N conductive segments are aligned parallel to the axial direction and are equidistantly arranged with respect to the azimuthal direction about the common longitudinal axis of the birdcage coil, the method comprises steps of:

controlling the individually adjustable level of radio frequency power provided at the magnetic resonance frequency by the plurality of M radio frequency amplifier units to a radio frequency power level that is substantially identical among the M radio frequency amplifier units;

controlling the relationship of adjustable phase angles of the magnetic resonance radio frequency power among the plurality of M radio frequency amplifier units according to $$\phi_i = \frac{2\pi}{N} \cdot (i - f), \quad (1)$$

wherein index number i denotes a conductive segment of the plurality of conductive segments of the birdcage coil, running from 1 to N in the azimuthal direction about the common longitudinal axis, and index f denotes an activation port of the plurality of N activation ports at which an absolute phase angle is arbitrarily defined to be 0.

In this way, the birdcage coil can be excited in quadrature mode or in an M-radio frequency channel multi-transmission mode, respectively, by using hardware components of lower power specifications.

As can be obtained from formula (1), if i=f (i.e. at an activation port that receives radio frequency power from a radio frequency amplifier unit of the plurality of M radio frequency amplifier units), the phase angle is zero. For the case of i−f=N/4, the phase angle shift results in π/2, i.e. 90°.

Preferably, the number of radio frequency amplifier units of the plurality of M radio frequency amplifier units equals the number of activation ports of the plurality of N activation ports, and each radio frequency amplifier unit provides radio frequency power at the magnetic resonance frequency to the birdcage coil via a different activation port of the plurality of N activation ports.

In yet another aspect of the present invention, a magnetic resonance imaging system configured for acquiring magnetic resonance images of at least a portion of a subject of interest is provided, comprising:

an examination space provided to position at least the portion of the subject of interest within;

a main magnet configured for generating a static magnetic field $B_0$ in the examination space;

a magnetic gradient coil system configured for generating gradient magnetic fields superimposed to the static magnetic field $B_0$;

at least one embodiment of the magnetic resonance radio frequency transmission device disclosed herein;

at least one radio frequency antenna device that is configured for receiving magnetic resonance signals from the nuclei of or within the portion of the subject of interest that have been excited by applying the radio frequency excitation field $B_1$;

a control unit configured for controlling functions of the magnetic resonance imaging system; and a signal processing unit configured for processing magnetic resonance signals to determine magnetic resonance images of at least the portion of the subject of interest from the received magnetic resonance signals.

BRIEF DESCRIPTION OF THE DRAWINGS

These and other aspects of the invention will be apparent from and elucidated with reference to the embodiments described hereinafter. Such embodiment does not necessarily represent the full scope of the invention, however, and reference is made therefore to the claims and herein for interpreting the scope of the invention.

In the drawings.

DETAILED DESCRIPTION OF EMBODIMENTS

In the following, several embodiments in accordance with the invention are disclosed. The individual embodiments are described with reference to a particular figure and are identified by a prefix number of the particular embodiment. Features whose function is the same or basically the same in all embodiments are identified by reference numbers made up of the prefix number of the embodiment to which it relates, followed by the number of the feature. If a feature of an embodiment is not described in the corresponding figure depiction, or a reference number mentioned in a figure depiction is not shown in the figure itself, the description of a preceding embodiment should be referred to.

Figure 1:
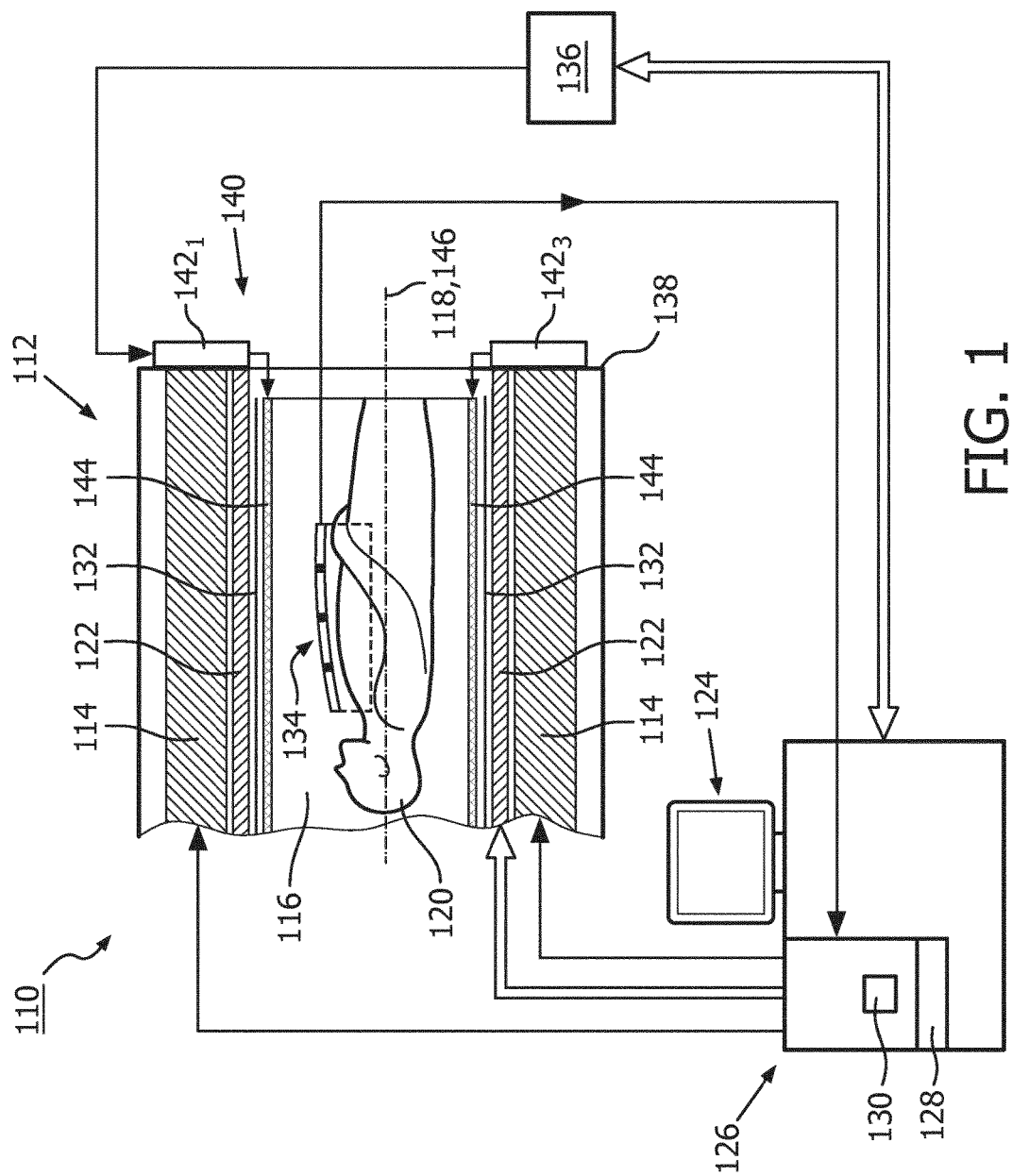
FIG. 1 shows a schematic illustration of a part of an embodiment of a magnetic resonance imaging system in accordance with the invention, FIG. 2 schematically illustrates the birdcage coil of the magnetic resonance radio frequency transmission device of the magnetic resonance imaging system pursuant to FIG. 1, FIG. 3 schematically illustrates the embodiment of a the magnetic resonance radio frequency transmission device in accordance of the magnetic resonance imaging system pursuant to FIG. 1, providing radio frequency power to the birdcage coil shown in FIG. 2.

FIG. 1 shows a schematic illustration of a part of an embodiment of a magnetic resonance imaging system 110 configured for acquiring magnetic resonance images of at least a portion of a subject of interest 120, usually a patient, in accordance with the invention. The magnetic resonance imaging system 110 comprises a scanner unit 112 having a main magnet 114. The main magnet 114 has a central bore that provides an examination space 116 around a center axis 118 for the subject of interest 120 to be positioned within, and is further provided for generating a static magnetic field $B_0$ at least in the examination space 116. For clarity reasons, a customary table for supporting the subject of interest 120 has been omitted in FIG. 1. The static magnetic field $B_0$ defines an axial direction of the examination space 116, aligned in parallel to the center axis 118. It is appreciated that the invention is also applicable to any other type of magnetic resonance imaging systems providing an examination region within a static magnetic field.

Further, the magnetic resonance imaging system 110 comprises a magnetic gradient coil system 122 configured for generating gradient magnetic fields superimposed to the static magnetic field $B_0$. The magnetic gradient coil system 122 is concentrically arranged within the bore of the main magnet 114.

The magnetic resonance imaging system 110 comprises a control unit 126 configured to control functions of the magnetic resonance imaging system 110. The control unit 126 includes a human interface device 124 formed by a monitor unit having a touch-sensitive screen.

Figure 3:
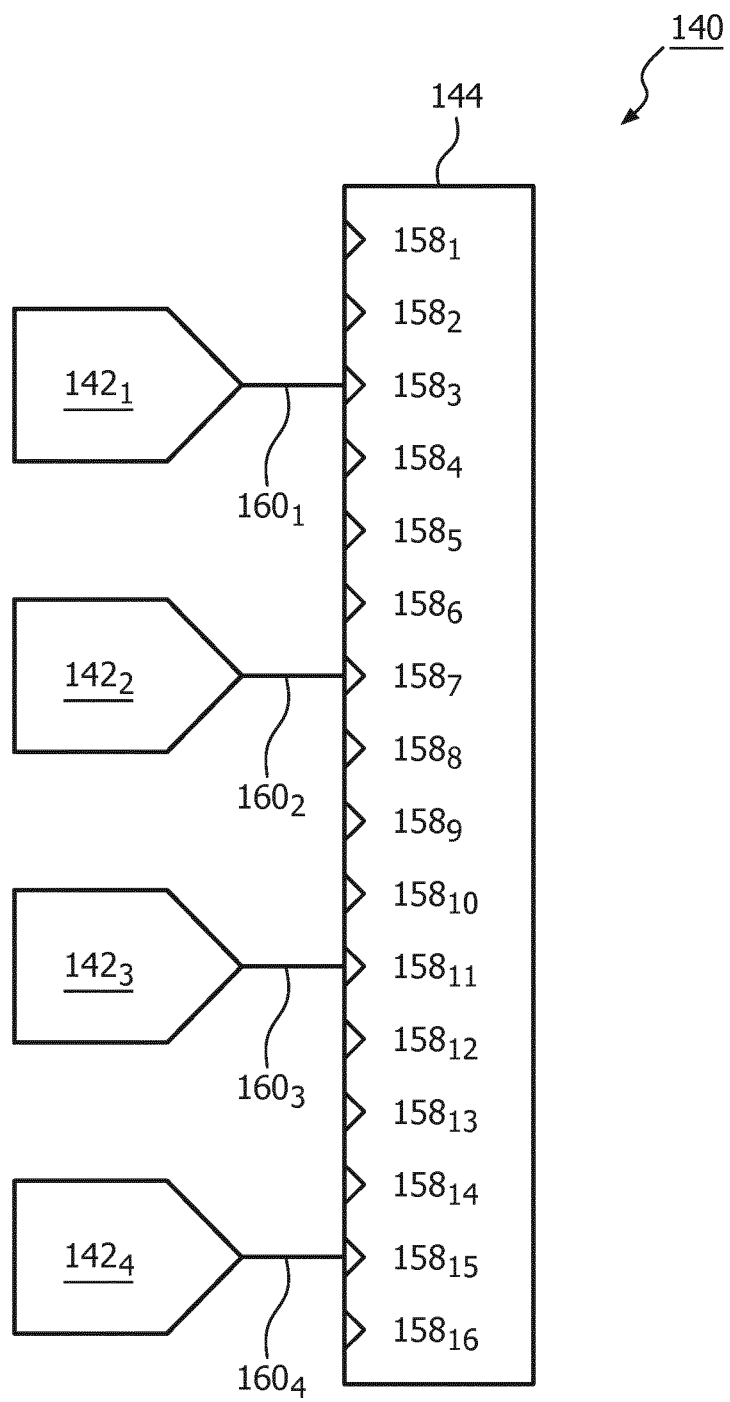

Furthermore, the magnetic resonance imaging system 110 includes a magnetic resonance radio frequency transmission device 140 for generating and applying a radio frequency excitation field $B_1$ of a magnetic resonance frequency during radio frequency transmit time periods to nuclei of or within the subject of interest 120 for the purpose of magnetic resonance examination. The magnetic resonance radio frequency transmission device 140 comprises a birdcage coil 144 designed as a whole-body coil and a plurality of four radio frequency amplifier units $142_1$-$142_4$ (FIG. 3). The birdcage coil 144 has a center axis 146 and, in the operational state, is arranged concentrically within the bore of the main magnet 114 such that the center axis 146 of the birdcage coil 144 and the center axis 118 of the scanner unit 112 coincide (FIG. 1).

Each radio frequency amplifier unit 142 of the plurality of radio frequency amplifier units $142_1$-$142_4$ is configured for receiving radio frequency power from a radio frequency source, for amplifying the received radio frequency power, and for providing the amplified radio frequency power of the magnetic resonance frequency to the birdcage coil 144.

To this end, radio frequency power is fed, controlled by the control unit 126, from a radio frequency transmitter 136 as the radio frequency source to the plurality of radio frequency amplifier units $142_1$-$142_4$ (shown in FIG. 1 exemplarily for radio frequency amplifier unit $142_1$).

As is well known in the art, a cylindrical, metallic radio frequency shield 132 is arranged concentrically between the magnetic gradient coil system 122 and the birdcage coil 144.

Moreover, the magnetic resonance imaging system 110 comprises a plurality of radio frequency antenna devices 134 provided for receiving magnetic resonance signals from the nuclei of or within the subject of interest 120 that have been excited by applying the radio frequency excitation field $B_1$. The radio frequency antenna devices 134 are designed as an array of local coils that are intended to be positioned proximal to a region of the subject of interest 120 to be imaged. The local coils are configured for receiving magnetic resonance signals from the excited nuclei of or within the portion of the subject of interest 120 to be imaged during radio frequency receiving time periods which are distinct from the radio frequency transmit time periods.

Furthermore, the magnetic resonance imaging system 110 comprises a signal processing unit 130 configured for processing magnetic resonance signals to determine magnetic resonance images of at least the portion of the subject of interest 120 from the received magnetic resonance signals.

Figure 2:
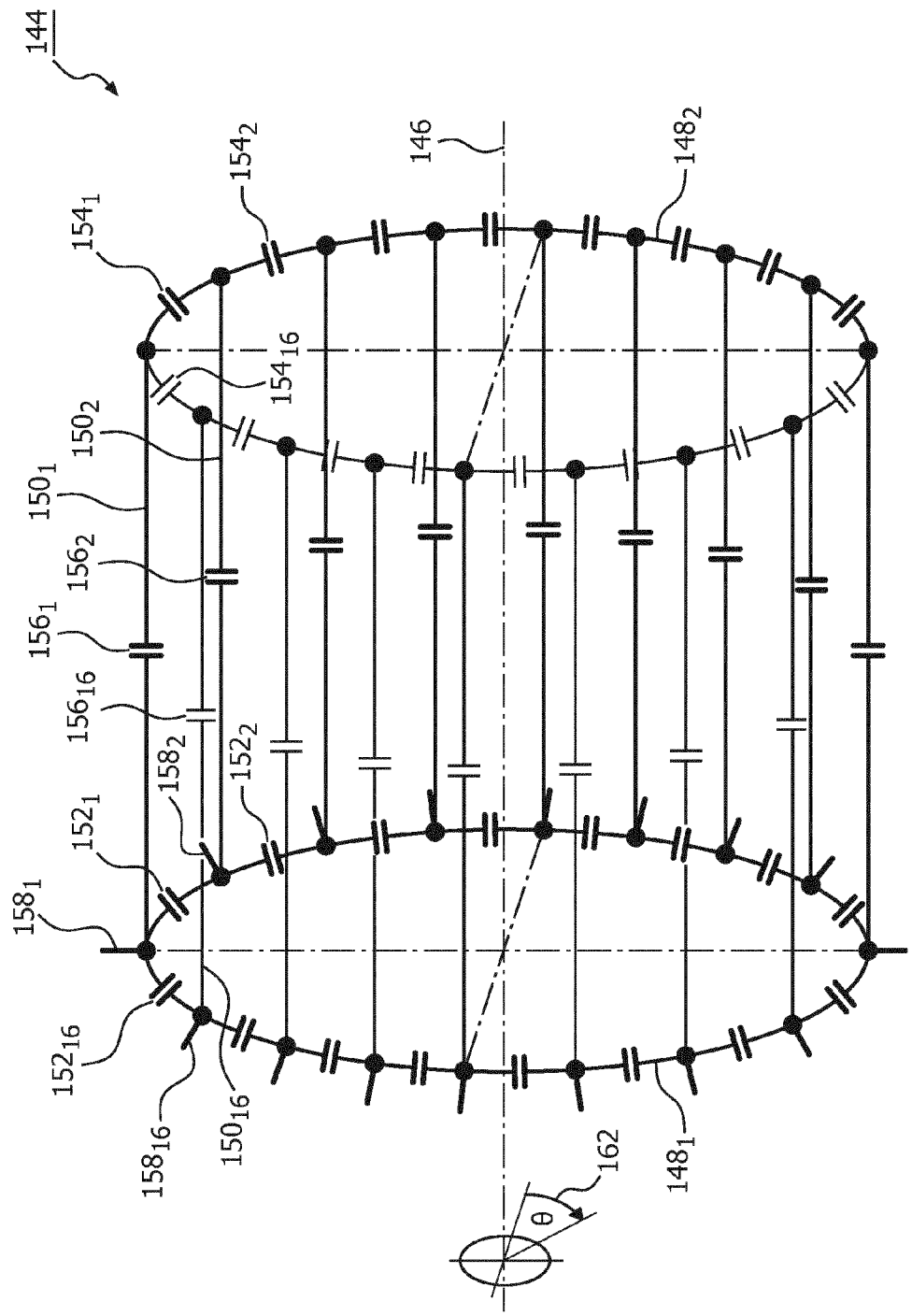

A schematic view of the birdcage coil 144 of the magnetic resonance radio frequency transmission device 140 is given in FIG. 2. The birdcage coil 144 includes a pair of identical conductive loop members $148_1$, $148_2$ spaced along a common longitudinal axis given by the center axis 146, and a plurality of N=16 conductive segments $150_1$-$150_{16}$ designed as straight conductors (rungs) that are aligned parallel to an axial direction. The birdcage coil 144 is designed as a band-pass type having a plurality of 2N loop capacitors $152_1$-$152_{16}$, $154_1$-$154_{16}$ placed in the conductive loop members $148_1$, $148_2$, in this way electrically interconnecting portions of the conductive loop members $148_1$, $148_2$ that form the conductive loop, and one rung capacitor $156_i$, i=1-N, of a plurality of N rung capacitors $156_1$-$156_{16}$ placed in each of the rungs, which electrically interconnect the portions of the conductive loop members $148_1$, $148_2$ between two adjacent loop capacitors $152_i$, $152_{i+1}$, $154_i$, $154_{i+1}$. The conductive segments $150_i$, i=1-N, of the plurality of N conductive segments $150_1$-$150_{16}$ are equidistantly arranged with respect to an azimuthal direction 162 about the center axis 146.

The birdcage coil 144 is designed to be excitable at N/2 separate resonance frequencies. Methods of selecting birdcage coil design parameters for accomplishing this are known in the art and therefore need not be discussed in detail herein. The two resonant modes of the birdcage coil 144 considered for excitation are the ones whose radio frequency current distribution in the rungs is proportional to $\sin \theta$ (mode 1) or $\cos \theta$ (mode 2), respectively, wherein $\theta$ denotes the azimuthal angle measured in the azimuthal direction 162 about the center axis 146 of the birdcage coil 144.

According to the invention, the birdcage coil 144 comprises a plurality of N=16 activation ports $158_1$-$158_{16}$. Each activation port $158_i$, i=1-16, is configured to receive radio frequency power and to transfer the received radio frequency power to the birdcage coil 144 for generating a portion of the radio frequency excitation field $B_1$. The activation ports $158_1$-$158_{16}$ of the plurality of N activation ports $158_1$-$158_{16}$ are located in close proximity to the birdcage coil 144, which is best illustrated in an alternative embodiment of the magnetic resonance radio frequency transmission device shown in FIG. 4.

The magnetic resonance radio frequency transmission device 140 includes a plurality of M=4 radio frequency amplifier units $142_1$-$142_4$ (FIG. 3), which is less than the number N=16, which in turn is an integer multiple of M. A maximum power of each of the radio frequency amplifier units $142_1$-$142_4$ is rated to be 4.4 kW, so that a total radio frequency power of about 18 kW is available for operating the birdcage coil 144. FIG. 3 schematically illustrates a configuration of the plurality of M=4 radio frequency amplifier units $142_1$-$142_4$, providing radio frequency power to the birdcage coil 144 via a plurality of M=4 activation ports selected out of the plurality of N=16 activation ports $158_1$-$158_{16}$. The selected activation ports are activation ports $158_3$, $158_7$, $158_{11}$, $158_{15}$.

Each radio frequency amplifier unit $142_i$, i=1-4, of the plurality of M=4 radio frequency amplifier units $142_1$-$142_4$ is configured to provide an individually adjustable level of radio frequency power at the magnetic resonance frequency to one activation port 158 of the plurality of selected M=4 activation ports $158_3$, $158_7$, $158_{11}$, $158_{15}$.

In an operational state of the birdcage coil 144, each radio frequency amplifier unit $142_i$, i=1-M, of the plurality of M=4 radio frequency amplifier units $142_1$-$142_4$ is electrically connected to one activation port 158 of the selected activation ports $158_3$, $158_7$, $158_{11}$, $158_{15}$ of the plurality of N=16 activation ports $158_1$-$158_{16}$ by a radio frequency transmission line $160_i$, i=1-4, having a length of less than one tenth of the effective wavelength of the resonance frequency in the radio frequency transmission line 160, and is thus arranged in close proximity to the activation port 158 to which it provides radio frequency power. In this embodiment of the magnetic resonance system 110 having a field strength of the static magnetic field $B_0$ of 3.0 T, which results in a magnetic resonance frequency of about 128 MHz for protons, and a velocity factor of the transmission line of 66%, the length of the transmission lines $160_1$-$160_4$ is less than about 0.15 m.

In the operational state, the birdcage coil 144 is driven by the plurality of M=4 radio frequency amplifier units $142_1$-$142_4$, providing magnetic resonance radio frequency power to the activation ports $158_3$, $158_7$, $158_{11}$, $158_{15}$ having amplitudes and relative phase angles $\phi_3$, $\phi_7$, $\phi_{11}$, $\phi_{15}$ according to (as customary, ω denotes the circular frequency of the magnetic resonance frequency)

activation port $158_3$: $-\frac{1}{2} \cdot a_{11} \cdot \cos(\omega t) + \frac{1}{2} \cdot b_{11} \cdot \sin(\omega t)$ activation port $158_7$: $\frac{1}{2} \cdot a_7 \cdot \cos(\omega t) - \frac{1}{2} \cdot b_7 \cdot \sin(\omega t)$ activation port $158_{11}$: $\frac{1}{2} \cdot a_{11} \cdot \cos(\omega t) - \frac{1}{2} \cdot b_{11} \cdot \sin(\omega t)$ activation port $158_{15}$: $-\frac{1}{2} \cdot a_7 \cdot \cos(\omega t) + \frac{1}{2} \cdot b_7 \cdot \sin(\omega t)$ (2)

In this way, activation ports $158_7$, $158_{15}$ are provided with radio frequency power having a phase shift of 180°. The same holds for activation ports $158_3$, $158_{11}$.

The four amplitudes $a_7$, $a_{11}$, $b_7$ and $b_{11}$ are independent and can be selected in order to accomplish a desired radio frequency excitation field $B_1$ by driving the birdcage coil 144 accordingly.

For instance, quadrature operation of the birdcage coil 144 can be accomplished by selecting amplitudes $b_7$ and $a_{11}$ as 0, and selecting amplitude $a_7$ to be equal to amplitude $b_{11}$. Pairs of activation ports $158_3$/$158_7$ and $158_{11}$/$158_{15}$, respectively, which are separated by an azimuthal angle Δθ of 90°, measured in the azimuthal direction 162 about the center axis 146 of the birdcage coil 144, are provided with radio frequency power having a relative difference of the phase angle φ of 90°.

As shown above, in the operational state of the birdcage coil 144, among the plurality of M=4 radio frequency amplifier units $142_1$-$142_4$ there is established a fixed relationship of adjustable phase angles $\phi_i$, i=1-4, of the magnetic resonance radio frequency power provided by the plurality of M=4 radio frequency amplifier units $142_1$-$142_4$.

For radio frequency shimming purposes, the four independent amplitudes $a_7$, $a_{11}$, $b_7$ and $b_{11}$ can be selected differently, for instance for compensating inhomogeneity of the radio frequency excitation field $B_1$ caused by the subject of interest 120. The birdcage coil 144 is then operated as a dual radio frequency channel multi-transmission coil with M amplifiers.

The individually adjustable level of radio frequency power provided at the magnetic resonance frequency by the plurality of M=4 radio frequency amplifier units $142_1$-$142_4$ and the fixed relationship of adjustable phase angles $\phi_i$, i=1-4, of the magnetic resonance radio frequency power among the plurality of M=4 radio frequency amplifier units $142_1$-$142_4$ is controlled by a control unit that is an integral part of the control unit 126 of the magnetic resonance imaging system 110.

Figure 4:
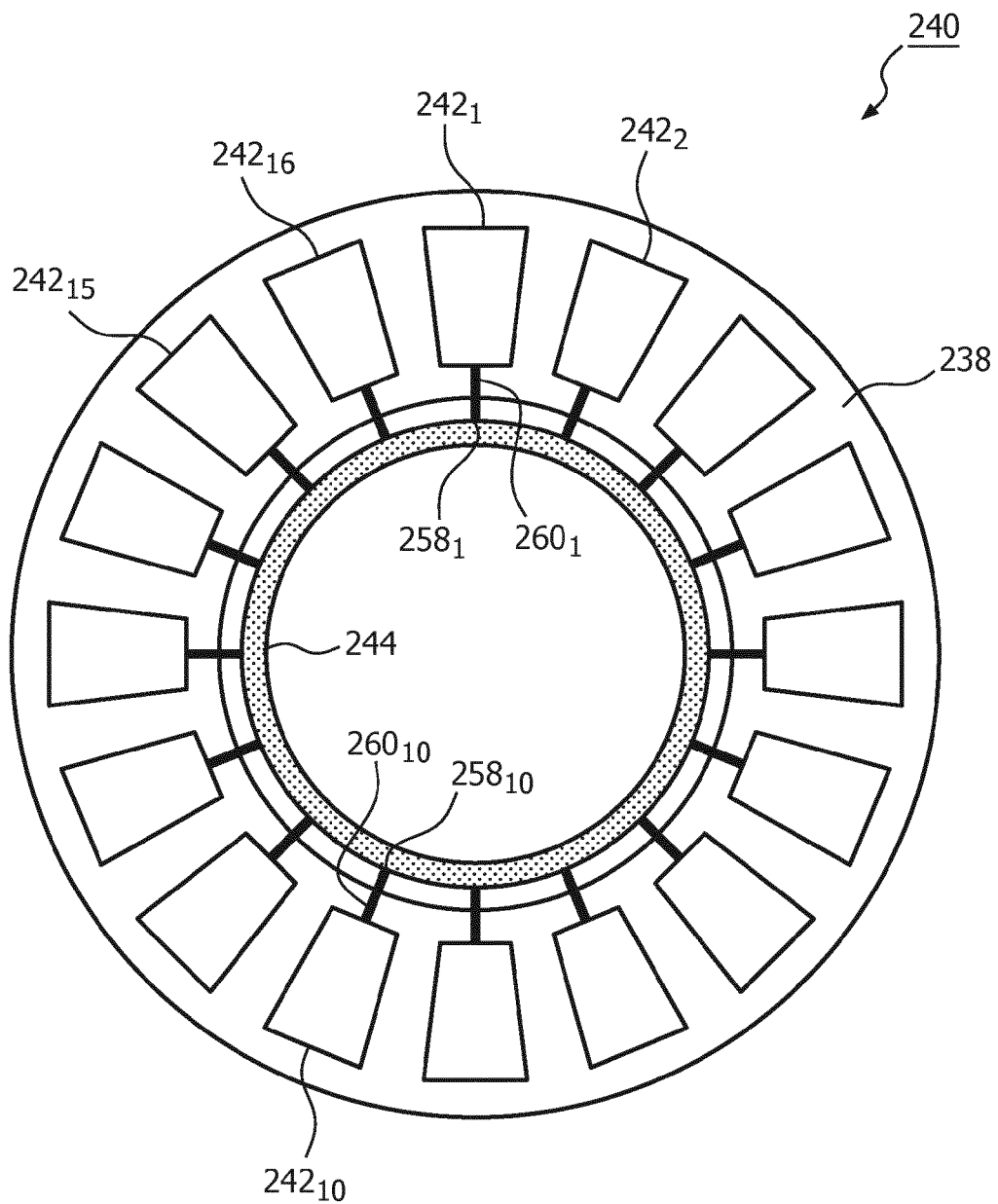
FIG. 4 depicts an alternative embodiment of a magnetic resonance radio frequency transmission device in accordance with the invention.

An alternative embodiment of a magnetic resonance radio frequency transmission device 240 in accordance with the invention is schematically illustrated in FIG. 4. Only features differing from the embodiment pursuant to FIG. 3 will be described. For features of the second embodiment that are not described hereinafter, reference is made to the description of the first embodiment.

In comparison to the first embodiment (FIG. 3), the embodiment of a magnetic resonance radio frequency transmission device 240 pursuant to FIG. 4 comprises a plurality of M=N=16 radio frequency amplifier units $242_1$-$242_{16}$, so that the number M of radio frequency amplifier units $242_1$-$242_{16}$ is equal to the number N of rungs of the birdcage coil 244.

A maximum power of each radio frequency amplifier unit $242_i$, i=1-16, of the plurality of the radio frequency amplifier units $242_1$-$242_{16}$ is rated to be 1.1 kW only. Nonetheless, a total radio frequency power of about 18 kW is still available for operating the birdcage coil 244. FIG. 4 schematically illustrates a configuration of the plurality of M=16 radio frequency amplifier units $242_1$-$242_{16}$ providing radio frequency power to the birdcage coil 244 via a plurality of M=N=16 activation ports $258_1$-$258_{16}$.

The radio frequency amplifier units $242_1$-$242_{16}$ are conveniently arranged on a flange 238 of the main magnet 214, in close proximity to the activation ports $258_1$-$258_{16}$, and each radio frequency amplifier unit $242_i$, i=1-16, of the plurality of the radio frequency amplifier units $242_1$-$242_{16}$ is electrically connected to one activation port $258_i$, i=1-16, of the plurality of activation ports $258_1$-$258_{16}$ by a frequency transmission line $260_i$, i=1-16, designed as a coaxial cable having a length of less than 0.15 m.

In the operational state, the birdcage coil 244 is driven by the plurality of M=N=16 radio frequency amplifier units $242_1$-$242_{16}$ providing magnetic resonance radio frequency power to the plurality of N=16 activation ports $258_1$-$258_{16}$ having amplitudes and relative phase angles $\phi_i$, i=1-16, according to $$\cos(\omega t) \cdot \left( a_7 \cdot \cos\left[\frac{2\pi}{N} \cdot (i-f)\right] + a_{11} \cdot \sin\left[\frac{2\pi}{N} \cdot (i-f)\right] \right) - \sin(\omega t) \cdot \left( b_7 \cdot \cos\left[\frac{2\pi}{N} \cdot (i-f)\right] + b_{11} \cdot \sin\left[\frac{2\pi}{N} \cdot (i-f)\right] \right) \quad (3)$$

wherein index number i denotes a conductive segment $250_i$ of the plurality of conductive segments $250_1$-$250_{16}$ of the birdcage coil 244, running from 1 to N in the azimuthal direction 262 about the center axis 246, and index f denotes an activation port $258_f$ at which an absolute phase angle is arbitrarily set to 0. In the above case, this is the case for activation port $258_7$.

Again, the four amplitudes $a_7$, $a_{11}$, $b_7$ and $b_{11}$ are independent and can be selected in order to accomplish a desired radio frequency excitation field $B_1$ by driving the birdcage coil 244 accordingly.

For instance, quadrature operation of the birdcage coil 244 can be accomplished by selecting amplitudes $b_7$ and $a_{11}$ as 0, and selecting amplitude $a_7$ to be equal to amplitude $b_{11}$. The individually adjustable level of radio frequency power provided at the magnetic resonance frequency by the plurality of M=N radio frequency amplifier units $242_1$-$242_{16}$ is then, according to (3), set to $a_7=b_{11}$, i.e. to a radio frequency power level that is substantially identical among the M=N radio frequency amplifier units $242_1$-$242_{16}$. The fixed relationship of adjustable phase angles $\phi_i$, i=1-16, of the magnetic resonance radio frequency power among the plurality of M=N radio frequency amplifier units $242_1$-$242_{16}$ is established according to $$\phi_i = \frac{2\pi}{N} \cdot (i-f)$$

From i=1 to N, phase angles $\phi_i$ are equal to $-135°$, $-112.5°$, $-90°$, $-67.5°$, $-45°$, $-22.5°$, $0°$, $22.5°$, $45°$, $67.5°$, $90°$, $112.5°$, $135°$, $157.5°$, $180°$ and $-157.5°$, respectively.

For radio frequency shimming purposes, the four independent amplitudes $a_7$, $a_{11}$, $b_7$ and $b_{11}$ and the phase angles $\phi_i$, i=1-16, can be selected differently, for instance for compensating inhomogeneity of the radio frequency excitation field $B_1$ caused by the subject of interest 220. The birdcage coil 244 is then operated as a 16-radio frequency channel multi-transmission coil.

Figure 5:
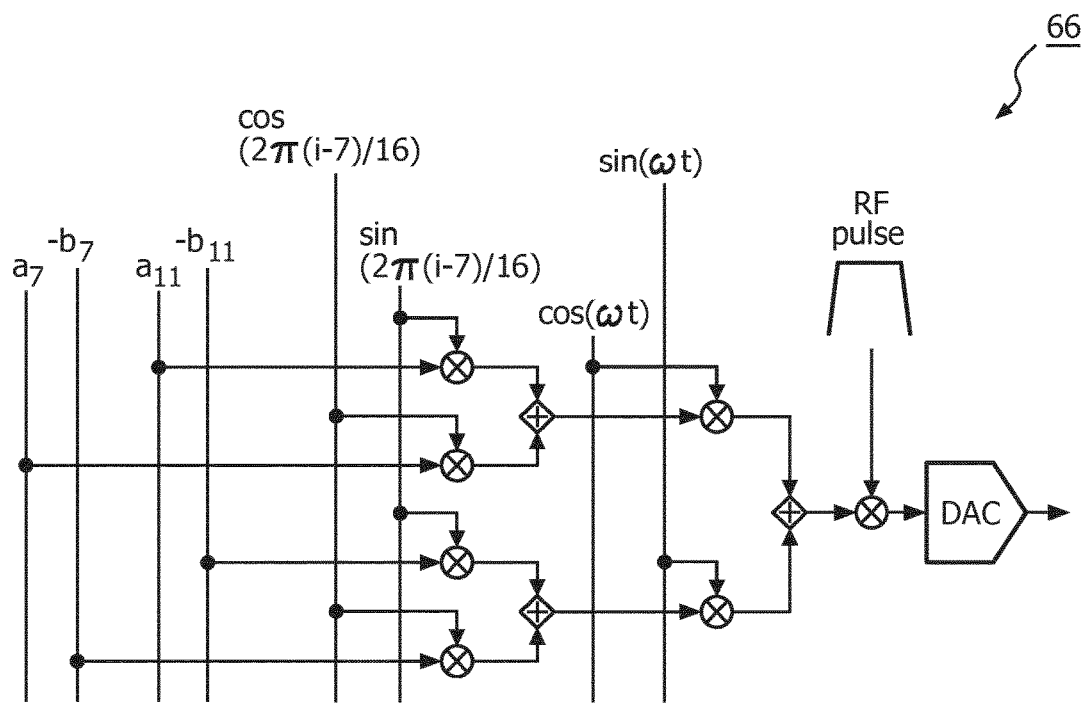
FIG. 5 is a schematic illustration of a digital wave generator of the control unit of the magnetic resonance imaging system pursuant to FIG. 1.
Figure 5:
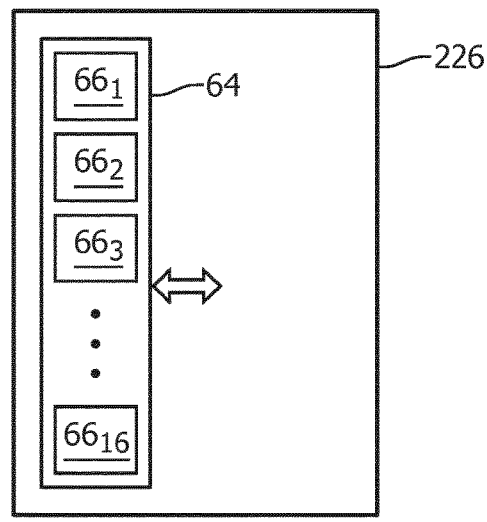

FIG. 5 shows a schematic illustration of a module 66 of a digital wave generator 64 which is an integral part of the control unit 226 of the magnetic resonance imaging system 210. The digital wave generator 64 comprises a plurality of modules $66_i$, i=1-16, each of which is assignable to one of the radio frequency amplifier units 242, of the plurality of M=N radio frequency amplifier units $242_1$-$242_{16}$. The control unit 226 controls the digital wave generator 64 that is based on a field programmable gate array, and that is configured for digitally establishing the fixed relationship of adjustable phase angles $\phi_i$, i=1-16, among the plurality of M=N radio frequency amplifier units $242_1$-$242_{16}$ according to formula (3), and for setting the individually adjustable levels of radio frequency power at the magnetic resonance frequency at the plurality of M=N radio frequency amplifier units $242_1$-$242_{16}$ according to formula (3).

Figure 6:
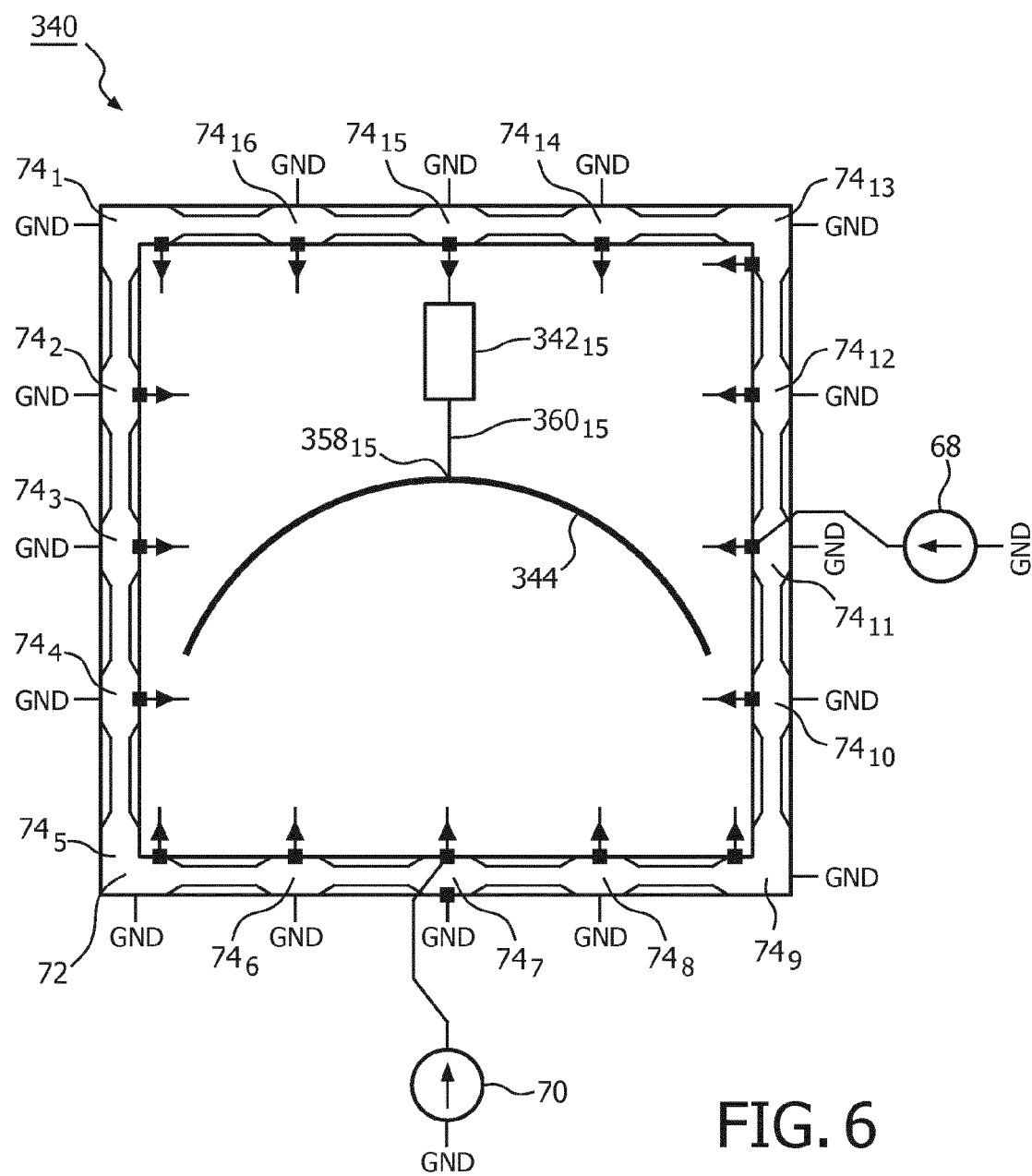
FIG. 6 is a schematic illustration of another alternative embodiment of a magnetic resonance radio frequency transmission device in accordance with the invention, and FIG. 7 schematically illustrates a typical conventional configuration of radio frequency amplifiers providing radio frequency power to a birdcage coil for quadrature mode excitation.
Figure 7:
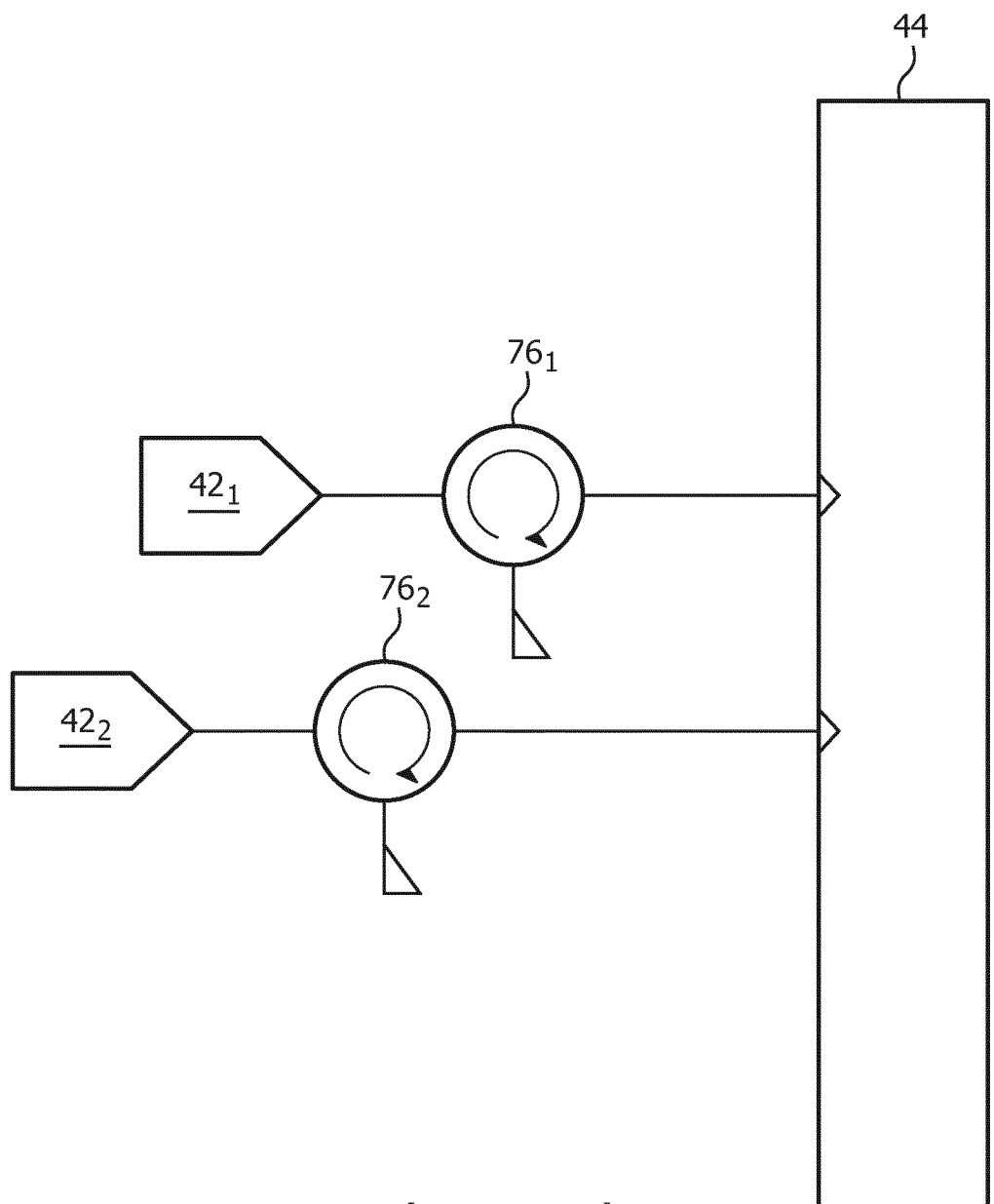

Another alternative embodiment of a magnetic resonance radio frequency transmission device 340 in accordance with the invention is schematically illustrated in FIG. 6.

In comparison to the embodiment pursuant to FIG. 4, the magnetic resonance radio frequency transmission device 340 shown in FIG. 6 further includes another radio frequency transmission line 72 having an effective electrical length corresponding to substantially one wavelength of the magnetic resonance frequency. The two ends of the radio frequency transmission line 72 are electrically connected to form a loop.

The magnetic resonance radio frequency transmission device 340 further includes a plurality of N=16 contact points $74_i$, i=1-N, electrically contacting the radio frequency transmission line 72 and being arranged along the radio frequency transmission line 72 in a spaced manner, wherein contact points 74, of the plurality of N contact points 74 i=1-N, are each configured for receiving radio frequency power from two independent radio frequency sources 68, 70.

In the embodiment shown in FIG. 6, contact points $74_7$ and $74_{11}$ receive radio frequency power from the two independent radio frequency sources 68, 70.

The number M of radio frequency amplifier units $342_i$, i=1-M, of the plurality of M radio frequency amplifier units $342_i$, i=1-M, equals the number N of activation ports $358_i$, i=1-N, of the plurality of N activation ports $358_i$, i=1-N. Each contact point 74, of the plurality of N contact points $74_i$, i=1-N, is electrically connected to an input port of a different radio frequency amplifier unit $342_i$ of the plurality of M=N radio frequency amplifier units $342_i$, i=1-16. The radio frequency path from contact point $74_{15}$ to radio frequency amplifier unit $342_{15}$ and further to activation port $358_{15}$ of birdcage coil 344 via transmission line $360_{15}$ is exemplarily and schematically indicated in FIG. 6.

In this way, the radio frequency power that is available at one of the N contact points $74_i$, i=1-N, is used as an input radio frequency power for one of the plurality of M=N radio frequency amplifier units $342_i$, i=1-16. A fixed relationship of adjustable phase angles $\phi_i$, i=1-16, and magnitudes of the magnetic resonance radio frequency power provided by the plurality of M=N radio frequency amplifier units $342_i$, i=1-16, is established by the radio frequency transmission line 72 in an analog way by the effective electrical length of portions of the radio frequency transmission line 72 between any two contact points $74_m$, $74_n$, m, n=1-16, wherein the effective electrical length between two adjacent contact points $74_n$, $74_{n+1}$ for any n is equal to $360°/N$.

Amplitudes and relative phase angles $\phi_k$, k=1, 2, of the two independent radio frequency sources 68, 70 are given by (cf. formula (2))

activation port $358_7$: $\frac{1}{2} \cdot a_7 \cdot \cos(\omega t) - \frac{1}{2} \cdot b_7 \cdot \sin(\omega t)$ activation port $358_{11}$: $\frac{1}{2} \cdot a_{11} \cdot \cos(\omega t) - \frac{1}{2} \cdot b_{11} \cdot \sin(\omega t)$ Quadrature operation of the birdcage coil 344 can be accomplished by selecting amplitudes $b_7$ and $a_{11}$ as 0 (which means a phase shift between the two independent radio frequency sources of (90°), selecting amplitude $a_7$ to be equal to amplitude $b_{11}$ and operating each radio frequency amplifier unit 342, of the plurality of M=N radio frequency amplifier units $342_i$, i=1-16, at the same gain, i.e. at the same individually adjustable level of radio frequency power.

For operating the birdcage coil 344 in a 2-radio frequency channel multi-transmission mode for the purpose of radio frequency shimming, the independent amplitudes $a_7$, $a_{11}$, $b_7$ and $b_{11}$ can be chosen as desired.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SYMBOL LIST:

| | |
|---|---|
| 10 | magnetic resonance imaging system |
| 12 | scanner unit |
| 14 | main magnet |
| 16 | examination space |
| 18 | center axis |
| 20 | subject of interest |
| 22 | magnetic gradient coil system |
| 24 | human interface device |
| 26 | control unit |
| 28 | digital memory unit |
| 30 | signal processing unit |
| 32 | radio frequency shield |
| 34 | plurality of receiving radio frequency antenna devices |
| 36 | radio frequency transmitter |
| 38 | flange |
| 40 | magnetic resonance radio frequency transmission device |
| 42 | radio frequency amplifier unit |
| 44 | birdcage coil |
| 46 | center axis |
| 48 | conductive loop member |
| 50 | conductive segment |
| 52 | loop capacitor |
| 54 | loop capacitor |
| 56 | rung capacitor |
| 58 | activation port |
| 60 | radio frequency transmission line |
| 62 | azimuthal direction |
| 64 | digital wave generator |

-continued

REFERENCE SYMBOL LIST:

| | |
|---|---|
| 66 | module |
| 68 | radio frequency source |
| 70 | radio frequency source |
| 72 | radio frequency transmission line |
| 74 | contact point |
| φ | phase angle |
| θ | azimuthal angle |

The invention claimed is:

1. A magnetic resonance radio frequency transmission device for generating and applying a radio frequency excitation field $B_1$ of a magnetic resonance frequency to nuclei of or within a subject of interest for the purpose of magnetic resonance examination, the magnetic resonance radio frequency transmission device comprising:
a birdcage coil including:
a pair of conductive loop members spaced along a common longitudinal axis,
a plurality of N conductive segments aligned parallel to an axial direction and electrically interconnecting the conductive loop members, and
a plurality of N activation ports, each activation port being configured to receive radio frequency power and to transfer the received radio frequency power to the birdcage coil for generating a portion of the radio frequency excitation field $B_1$, wherein the plurality of N activation ports is located in close proximity to the birdcage coil;
wherein the birdcage coil is designed to be excitable at at least N/2 separate resonance frequencies,
the magnetic resonance radio frequency transmission device further including:
a plurality of M radio frequency amplifier units, each radio frequency amplifier unit being configured for receiving radio frequency power from a radio frequency source and for amplifying the received radio frequency power, for providing radio frequency power at a magnetic resonance frequency to the birdcage coil via a plurality of M activation ports selected out of the plurality of N activation ports, wherein M is less than or equal to N, and wherein each radio frequency amplifier unit of the plurality of M radio frequency amplifier units is configured to provide an individually adjustable level of radio frequency power at the magnetic resonance frequency to one activation port of the plurality of M activation ports;
wherein, in an operational state of the birdcage coil, each radio frequency amplifier unit of the plurality of M radio frequency amplifier units is electrically connected to an activation port of the plurality of N activation ports by a radio frequency transmission line, and is arranged in close proximity to the activation port to which it provides radio frequency power;
and wherein, in the operational state of the birdcage coil, among the plurality of M radio frequency amplifier units there is established a fixed relationship of adjustable phase angles and adjustable magnitudes of the magnetic resonance radio frequency power provided by the plurality of M radio frequency amplifier units and the magnetic resonance radio frequency transmission device comprising another radio frequency transmission line having
an effective electrical length corresponding to substantially one wavelength of the magnetic resonance frequency, wherein two ends of the radio frequency transmission line are electrically connected to form a loop,
a plurality of N contact points, electrically contacting the radio frequency transmission line and being arranged along the radio frequency transmission line in a spaced manner, wherein at least two contact points of the plurality of N contact points are each configured for receiving radio frequency power from at least one radio frequency source;
wherein the number of radio frequency amplifier units of the plurality of M radio frequency amplifier units equals the number of activation ports of the plurality of N activation ports, and wherein each contact of the plurality of N contact points is electrically connected to a different radio frequency amplifier unit of the plurality of M =N radio frequency amplifier units.

2. The magnetic resonance radio frequency transmission device as claimed in claim 1, wherein N is an integer multiple of M.

3. The magnetic resonance radio frequency transmission device as claimed in claim 1, wherein the conductive segments the plurality of N conductive segments aligned parallel to the axial direction are equidistantly arranged with respect to an azimuthal direction about the common longitudinal axis of the birdcage coil.

4. The magnetic resonance radio frequency transmission device as claimed in claim 1, further comprising a control unit that is configured
to control the individually adjustable level of radio frequency power provided at the magnetic resonance frequency by the plurality of M radio frequency amplifier units, and/or
to control the fixed relationship of adjustable phase angles of the magnetic resonance radio frequency power among the plurality of M radio frequency amplifier units.

5. The magnetic resonance radio frequency transmission device as claimed claim 4, wherein the control comprises a digital wave generator that is configured for digitally establishing the fixed relationship of adjustable phase angles among the plurality of M radio frequency amplifier units, and for setting the individually adjustable levels of radio frequency power at the magnetic resonance frequency at the plurality of M radio frequency amplifier units.

6. The magnetic resonance radio frequency transmission device as claimed claim 5, wherein the digital wave generator is based on a field programmable gate array.

7. The magnetic resonance radio frequency transmission device as claimed in claim 1, wherein
the fixed relationship of adjustable phase angles and
the individually adjustable levels of radio frequency power at the magnetic resonance frequency of the plurality of M radio frequency amplifier units are set for operating the birdcage coil in the quadrature mode.

8. A magnetic resonance imaging system configured for acquiring magnetic resonance images of at least a portion of a subject of interest, comprising:
an examination space provided to position at least the portion of the subject of interest within;
a main magnet provided for generating a static magnetic field $B_0$ at least in the examination space;
a magnetic gradient coil system configured for generating gradient magnetic fields superimposed to the static magnetic field $B_0$;

at least one magnetic resonance radio frequency transmission device as claimed in claim 1;

at least one radio frequency antenna device that is configured for receiving magnetic resonance signals from the nuclei of or within the portion of the subject of interest that have been excited by applying the radio frequency excitation field $B_1$;

a control unit configured for controlling functions of the magnetic resonance imaging system; and a signal processing unit configured for processing magnetic resonance signals to determine magnetic resonance images of at least the portion of the subject of interest from the received magnetic resonance signals.

* * * * *